United States Patent [19]

Christenson

[11] Patent Number: 4,882,294
[45] Date of Patent: Nov. 21, 1989

[54] PROCESS FOR FORMING AN EPITAXIAL LAYER HAVING PORTIONS OF DIFFERENT THICKNESSES

[75] Inventor: John C. Christenson, Kokomo, Ind.

[73] Assignee: Delco Electronics Corporation, Kokomo, Ind.

[21] Appl. No.: 233,319

[22] Filed: Aug. 17, 1988

[51] Int. Cl.[4] .................. H01L 21/00; H01L 21/02; H01L 21/72; H01L 21/76

[52] U.S. Cl. ........................... 437/90; 437/89; 437/84; 437/970; 148/DIG. 150

[58] Field of Search ............... 437/77, 83, 84, 89, 437/90, 93, 99, 126, 970; 148/DIG. 29, DIG. 150, DIG. 152

[56] References Cited

U.S. PATENT DOCUMENTS

| | | | |
|---|---|---|---|
| 4,270,960 | 6/1981 | Bollen et al. | 437/109 |
| 4,323,417 | 4/1982 | Lam | 437/84 |
| 4,346,513 | 8/1982 | Nishizawa et al. | 437/93 |
| 4,592,792 | 6/1986 | Corboy, Jr. et al. | 437/89 |
| 4,659,392 | 4/1987 | Vasudev | 437/24 |
| 4,755,487 | 7/1988 | Scovell et al. | 437/174 |

FOREIGN PATENT DOCUMENTS

| | | | |
|---|---|---|---|
| 0063839 | 5/1980 | Japan | 437/89 |
| 0095633 | 6/1982 | Japan | 437/90 |
| 0044737 | 3/1983 | Japan. | |
| 8404995 | 12/1984 | World Int. Prop. O. | 437/99 |

*Primary Examiner*—Brian E. Hearn
*Assistant Examiner*—B. Everhart
*Attorney, Agent, or Firm*—Robert J. Wallace

[57] ABSTRACT

An integrated circuit device uses a silicon chip having an epitaxial layer which has two portions of different thicknesses in which are formed separate junction transistors of different characteristics. In the growth of the epitaxial layer there is first formed on the front surface of the chip a localized sacrificial silicon dioxide layer removable in situ by baking in a reducing atmosphere. Then an epitaxial layer is grown by a first epitaxial deposition phase selectively over only the silicon dioxide free regions of the front surface of the chip. The sacrificial silicon dioxide layer is then removed in situ by baking in hydrogen. There is then resumed blanket growth of the epitaxial layer by a second epitaxial deposition phase. In the resulting chip, a large geometry junction transistor of relatively low switching speed and moderately high breakdown voltage (compared to 12 volts) is formed in the thicker epitaxial portion and a small geometry junction transistor of high switching speed and lower breakdown voltage is formed in the thinner epitaxial portion.

23 Claims, 9 Drawing Sheets

PROCESS FOR FORMING AN EPITAXIAL LAYER HAVING PORTIONS OF DIFFERENT THICKNESSES

FIELD OF THE INVENTION

This invention relates to the manufacture of integrated circuit devices, and more particularly to such devices which use a semiconductor chip that includes an epitaxial layer having portions of different thicknesses.

BACKGROUND OF THE INVENTION

Various integrated circuit devices can be formed in a semiconductor chip which includes an epitaxial layer comprising at least two portions of different thicknesses. Such an epitaxial layer facilitates the inclusion in the integrated circuit of circuit elements, such as transistors, having different properties. For example, transistors that have relatively small geometries and relatively high switching speeds are localized in an epitaxial portion of narrow thickness. These small geometry transistors tend to be vulnerable to surges of high voltage and/or high current. To protect the small geometry (size) transistors against surges of high current and/or high voltage, transistors of larger geometry (size), but slower switching speed, are localized in an epitaxial portion of larger thickness. Additionally, a common semiconductor chip having epitaxial portions of different thicknesses may facilitate the inclusion of diverse circuit elements, such as diodes, resistors, capacitors and transistors. Still further, epitaxial portions of different thicknesses may be used to facilitate the fabrication in a common chip of Complementary Metal-Oxide-Semiconductor (CMOS) circuits and/or circuits involving combinations of bipolar and insulated gate field effect transistors.

For these reasons the prior art includes integrated circuit devices using a semiconductor chip including epitaxial layers having portions of different thicknesses. Various techniques have been used hitherto to prepare such a chip.

One process involves forming on a monocrystalline semiconductive substrate an epitaxial layer of a desired first thickness and then, after masking the substrate, selectively thinning some portions of the layer to a desired smaller thickness.

Another process includes: forming two cavities of different depths in a suitable substrate; growing an epitaxial layer of a first thickness that completely fills the shallower cavity but only partially fills the deeper cavity; and then, after masking the region of the shallower cavity, completing the filling of the deeper cavity with a second localized epitaxial deposition.

Still another process involves: forming a first epitaxial layer over a suitable substrate in a deposition chamber; removing the substrate from the deposition chamber to thin or remove selected portions of this epitaxial layer; and then returning the substrate to the deposition chamber for resuming the growth of epitaxial material over the substrate.

In general, the need for plural insertions and withdrawals of the substrate into and out of a deposition chamber adds to the complexity of a process for forming an epitaxial layer having portions of different thicknesses. Typically the greater the complexity of a process, the higher its cost and the lower its yield.

SUMMARY OF THE INVENTION

The present invention is directed to a process for forming an epitaxial layer having portions of different thicknesses that advantageously involves only a single insertion and a single withdrawal of the substrate from a deposition chamber or furnace in which the expitaxial material is grown.

In particular, in a process in accordance with the invention, a surface of a semiconductive substrate, typically silicon, on which is to be formed an epitaxial layer having portions of different thicknesses, is first treated to include an appropriate sacrificial masking layer over the regions where the thinner thickness is desired. Then the masked substrate is placed in a deposition chamber and an epitaxial layer is grown selectively only over the unmasked regions of the substrate. The growth is selective because over the masked regions there are absent nucleation centers about which an epitaxial layer can grow. Then, advantageously without withdrawing the substrate from the deposition chamber, the chamber ambient is changed. In particular, the new ambient is suited for selectively removing the sacrificial masking layer with little effect on the epitaxial layer. After the sacrificial layer is removed, the chamber ambient is returned to one suited for further epitaxial deposition. Then epitaxial growth is resumed for augmenting the previously deposited epitaxial layer and extending the epitaxial growth over the later exposed regions of the substrate. The resulting epitaxial layer has portions of greater thickness, corresponding to regions of the substrate experiencing both epitaxial deposition phases, and portions of lesser thickness, corresponding to regions of the substrate experiencing only the later epitaxial deposition phase. Moreover, it is feasible to modify the ambient during the second deposition phase with respect to that of the first deposition phase to provide different electronic properties to the portions of the layer grown in the two deposition phases.

Moreover, the invention may be readily adapted to provide a semiconductor chip with an epitaxial layer having portions of three or more different thicknesses. For an example of three portions, there is initially provided over a selected surface of a semiconductive substrate, a sacrificial masking layer having both a thicker portion and a thinner portion. Then the surface is exposed to a first epitaxial deposition phase. This is followed by in situ removal of the thinner portion of the sacrificial masking layer with only thinning of the thicker portion. This is followed by a second epitaxial deposition phase. Next, there follows in situ removal of the remainder of the sacrificial masking layer. Finally, there follows a third epitaxial deposition phase. After completion of this third deposition phase, the epitaxial layer comprises three portions: a first that has experienced all three deposition phases; a second that has experienced only the last two deposition phases; and a third that has experienced only the last deposition phase.

Advantageously, in these processes the sacrificial layer is a thermally grown layer of a silicon oxide (typically silicon dioxide) that is readily removed by heating in a reducing ambient, such as hydrogen gas. Accordingly, the sacrificial layer is removable without withdrawing the substrate from the deposition chamber by merely changing the ambient in the chamber.

The invention will be better understood from the following more detailed description taken with the accompanying drawing.

BRIEF DESCRIPTION OF THE DRAWINGS

FIGS. 1A through 1K show cross sectional views of a silicon chip, which includes two bipolar junction transistors formed in portions of different thicknesses of a continuous epitaxial layer, during manufacture in accordance with an illustrative embodiment of the invention;

It is to be noted that the drawings are not to scale since the vertical dimensions are much smaller than the horizontal dimensions and that background lines are typically not shown to make the drawing easier to understand.

DETAILED DESCRIPTION

Figure 1A:
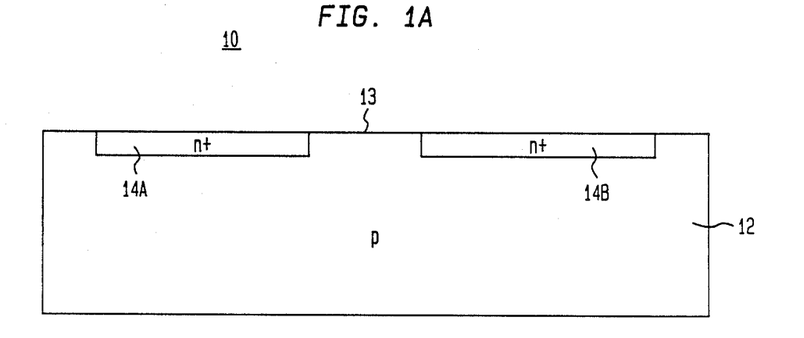

Referring now to FIG. 1A, there is shown a cross sectional view of a portion of a monocrystalline silicon wafer 10 in which are to be formed two bipolar transistors having different voltage breakdown properties. To this end, critical regions of the two transistors are to be formed in an epitaxial layer having portions of different thicknesses. A first bipolar transistor that has a base-collector junction that can readily withstand, without breakdown, reverse bias voltages of at least 30 volts will be formed in a thicker portion of the epitaxial layer. A second bipolar junction transistor that need withstand, without breakdown, reverse bias voltages of no higher than about twelve volts will be formed in a thinner portion of the epitaxial layer.

In automotive applications there is a need for a circuit which includes forms of both such transistors. Accordingly, if the circuit is to be made in a single integrated circuit silicon chip, there is a need for a chip that includes both such transistors. For example, a circuit useful for control purposes advantageously employs junction transistors with high switching speeds as the logic elements of the circuit. Such transistors tend to be of small geometry and so would be formed in thin epitaxial portions of the chip. However, such small transistors are vulnerable to damage from excessively high voltages. In particular, it is important to protect such small transistors from the situation that arises, for example, when a jump-start of a car engine is attempted with the battery poles mistakenly reversed. To provide this protection, it is advantageous to include in the circuit protective junction transistors able to withstand such high voltages. These protective transistors are typically of larger geometry and lower switching speed than the transistors used for the logic functions. Such transistors would best be formed in thick epitaxial portions of a chip.

Today's five inch silicon wafers permit a large number of chips, each comprising one or more circuits, to be prepared in parallel in the wafer. Eventually, the wafer is diced into a number of individual chips, each including one or more integrated circuits. However, for ease of explanation, this description and the drawing will focus on a portion of the wafer only large enough to include only one of each of the two different designs of the junction transistors. Moreover, usually two such transistors would advantageously differ in various dimensions because of the difference in switching speed requirements. However, in the interest of simplicity, the only difference in dimension shown in the drawing is in the thickness of the portion of the epitaxial layer in which each transistor is being formed.

As shown in FIG. 1A, the silicon wafer 10 whose bulk 12 is of p-type conductivity has already been provided with a pair of diffused surface regions 14A and 14B of n-type conductivity that are useful for forming buried collector layers of the two transistors to be formed in the wafer 10. Regions 14A and 14B are typically relatively heavily doped and are shown as of n+ type conductivity. Advantageously, the wafer 10 has been prepared so that a top surface 13 thereof on which an epitaxial layer is to be grown corresponds to a {100} crystal plane. As is known, epitaxial layers grow readily on such a surface, although other growth planes are also feasible, such as the {111} plane.

Various known techniques are available for forming the n+ type diffused regions 14A and 14B. These include diffusion through a patterned silicon oxide masking layer or ion implantation through a suitable patterned mask followed by a drive-in diffusion and annealing to repair wafer damage resulting from the ion implantation. It is usually preferable to use a donor that diffuses relatively slowly, such as arsenic, to avoid excessive autodoping of the epitaxial layers to be formed thereover.

Typically, the processing of a wafer begins by cleaning, including first baking it in a reducing atmosphere for several minutes to rid the surface of contaminants and any native oxide that may have formed on the surface.

Figure 1B:
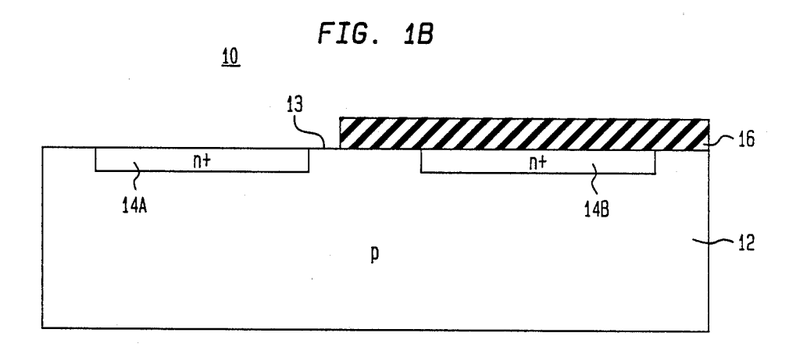

Referring now to FIG. 1B, there is shown a patterned sacrificial layer 16 over a portion of the top surface 13 of silicon wafer 10. The sacrificial layer 16 needs to have a number of characteristics as will appear more fully as the description proceeds. Fortuitously, a layer of a thermally grown silicon oxide (essentially silicon dioxide) has all of the desired properties. Typically, the layer 16 is at least 75 Angstroms thick. The difficulty at the present stage of production technology in reliably controlling thinner thicknesses makes thinner layers presently impractical. At a future time, this may no longer be the case. Moreover, since the thicker the sacrificial layer 16, the longer the processing time for its initial formation and for its later removal, a reasonable upper limit for the thickness is presently about 150 Angstroms. In special instances, thicker layers may be desirable.

As shown to FIG. 1B, the sacrificial layer 16 is patterned to expose a portion of the surface 13 of the silicon wafer 10 where the thicker epitaxial layer portion is to be formed. Typically, this involves masking the surface 13 of the wafer 10 appropriately and then removing the silicon oxide 16 selectively where unmasked to expose the underlying silicon wafer 10. Various techniques are known for patterning silicon oxide layers, including both wet etching with a suitable liquid bath and dry etching with a suitable gas plasma.

Then the wafer 10, after suitable washing, is generally ready for inserting in a furnace (not shown) that will serve as the deposition chamber. The furnace may be of the type generally used for silicon epitaxial deposition. Such furnaces are adapted for easy change of the gases flowed therethrough to create its ambient.

Often it is advantageous to begin the furnace processing with a short bake of several minutes in a reducing ambient, typically provided by a flow of hydrogen gas $H_2$. This cleans away any surface contaminants and any native oxide that may have formed unintended where the silicon surface was exposed. This treatment should not be so long as to reduce excessively the thickness of sacrificial the oxide layer 16. If the sacrificial oxide layer 16 was initially at least 75 Angstroms thick, it is usually safe to remove as much as 25 or 30 Angstroms of thickness at this stage. If it is found desirable to remove more, appropriate adjustment may be made in the initial thickness grown of the sacrificial oxide layer 16.

After the preliminary cleaning is done, the flow of hydrogen into the furnace is stopped. There is substituted a flow of a gaseous mixture for producing an ambient suitable for selective epitaxial deposition where the clean silicon surface is exposed. A general review of this selective deposition technology is provided in a paper entitled "Historical Review of SEG and Future Trends in EPI Technology" by J. O. Borland and published in the *Proceedings of the Tenth International Conference on Chemical Vapor Deposition, 1987 High Temperature Materials, Dielectrics and Insulation, and Electronics Divisions Proceedings*, Vol. 87-8, of the Electrochemical Society. I have found especially suitable a selective deposition process of the type described in a paper published in the *Japanese Journal of Physics*, Vol. 21, No. 9, page L564, September 1982 by K. Tanno et al. In this deposition process, a gaseous mixture of dichlorosilane ($SiH_2Cl_2$) and hydrochloric acid (HCl) is flowed through the furnace for this first epitaxial deposition phase. An exemplary mixture is formed by a flow of 270 cubic centimeters per minute of dichlorosilane combined with a flow of two liters per minute of hydrochloric acid for a furnace with a volume of about 60 liters, as is characteristic of a commerically available Applied Materials 7800 series barrel reactor. With this mixture and with the furnace kept at about 950° C. and at a pressure of about 50 TORR (1 TORR equals 1/760 of an atmosphere), an epitaxial layer of high quality silicon about 3 microns thick is formed in about sixteen minutes. Of course, other flow conditions are feasible and a typical range of temperatures might be from 850° C. to 1000° C. and a typical range of pressures from 20 TORR to 80 TORR.

Figure 1C:
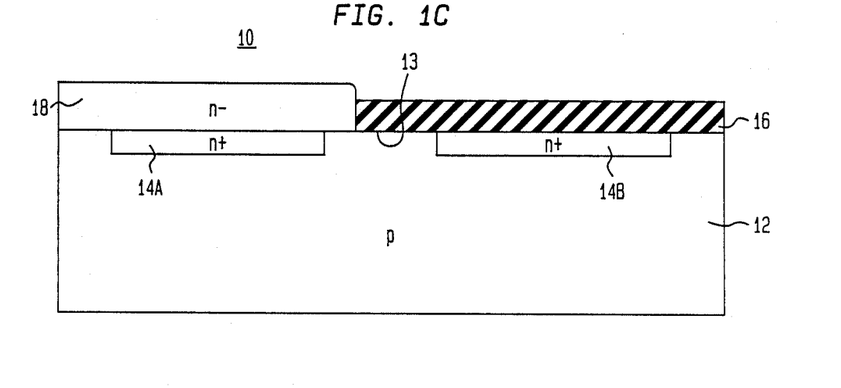

Referring now to FIG. 1C, an epitaxial silicon layer 18 grows selectively only where the wafer 10 surface 13 is exposed and free of oxide layer 16. The inclusion of HCl in the mixture appears to prevent any silicon deposit on the sacrificial oxide layer 16.

Figure 1D:
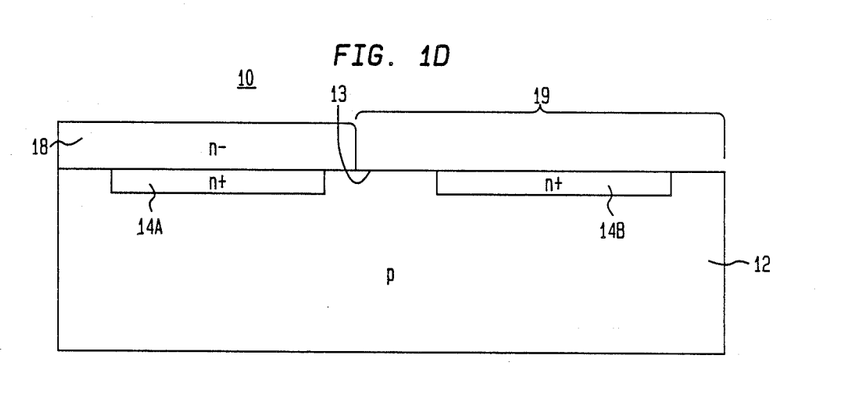

After completion of this first epitaxial growth phase, the ambient conditions in the furnace are changed to terminate the first epitaxial deposition phase and to proceed with a sacrificial material (oxide) removal phase. To this end, a flow of hydrogen gas of about 100 liters per minute is then substituted. The pressure in the furnace is kept at about 50 TORR and the temperature is increased to about 1200° C. Under these conditions, a sacrificial layer of silicon oxide about 150 Angstroms thick is removed in about twelve minutes. Thinner layers would be removed in correspondingly shorter times. It is important to continue the treatment long enough to ensure the desired complete removal. It is of course possible to vary the rate of removal by varying the conditions in the furnace. The process described may also lift off any traces of amorphous silicon that may have unintendedly deposited over the oxide layer 16. It should little affect the epitaxial silicon grown on the exposed silicon substrate. In FIG. 1D, there is shown the resultant with epitaxial layer 18 unchanged, but with the oxide layer 16 removed. This exposes a portion 19 of top surface 13 which was previously covered by oxide layer 16.

Now the wafer 10 is ready for the second epitaxial deposition phase. To this end, the reducing ambient in the furnace is replaced with an epitaxial deposition ambient. It is feasible to employ the same ambient used for the first epitaxial deposition phase. However, because there is no longer a need for selective epitaxial growth, it is usually preferable to employ a different ambient that provides faster growth. In particular, for this second deposition phase, a flow of 15 liters per minute of silicon tetrachloride ($SiCl_4$), with the furnace kept at about 1200° C. and at atmospheric pressure, is usually preferable. In several minutes this ambient grows an epitaxial layer of about 2 microns thickness. These deposition conditions resemble the conditions normally used in the industry for unselective silicon epitaxial deposition. Of course, other deposition conditions are feasible.

Figure 1E:
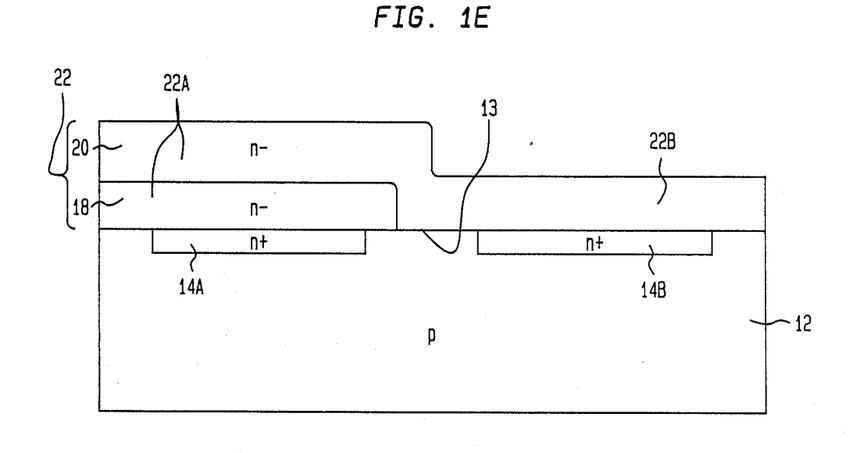

Referring now to FIG. 1E, there is shown an epitaxial layer 20 resulting from this second deposition phase. Layer 20 extends over the whole surface 13 of the wafer 10, growing over original layer 18 to increase the thickness of epitaxial growth where layer 18 was localized. Accordingly, there results a merged epitaxial layer 22 having a thick portion 22A comprising portions of layers 18 and 20, and a thin portion 22B limited to a portion of layer 20.

In the illustrative embodiment being described, a separate n-p-n planar junction transistor is thereafter formed in each of the two portions 22A, 22B of the epitaxial layer 22. To this end both deposition phases for forming the epitaxial layer 22 are designed to grow epitaxial material which is lightly doped n-type. It is to be appreciated that for other applications it may be desirable to grow material differently doped in the two separate deposition phases. As is known, the doping of an epitaxial layer can be controlled readily by including an appropriate dopant in the gaseous flow used to deposit the epitaxial material. In the instant embodiment, the flow during each epitaxial deposition phase includes arsenide for doping the growth n-type. The amount included is chosen to provide a desired resistivity in the material grown.

For the remainder of the processing, various known techniques can be used for forming the separate n-p-n transistors in portions 22A and 22B of the epitaxial layer 22.

Figure 1F:
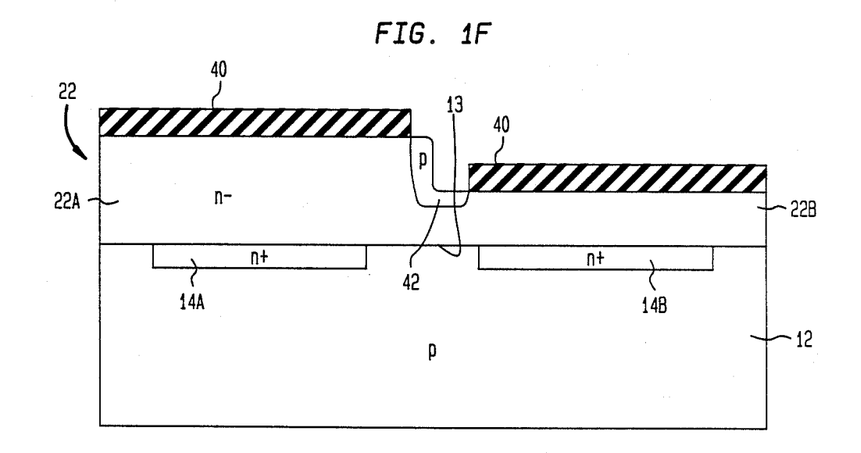

In the illustrative example to be described, junction isolation will be used to separate the two transistors electrically from one another. To this end, with reference to FIG. 1F, a masking layer 40, typically a conventional thermally grown silicon oxide (typically essentially silicon dioxide) layer, suitable for use as a diffusion mask, is deposited over the surface of the epitaxial layer 22. This layer 40 is then patterned in known fashion to expose the surface of layer 22 at the step between its thick and thin portions 22A, 22B, respectively. This exposed region is then doped with a p-type dopant, such as boron, typically by vapor-solid diffusion in known fashion, to form a p-type isolation region 42. As shown, the region 42 does not yet extend completely through layer 22 to the p-type bulk 12 of the wafer 10. By the end of the processing it will so extend. The desired further penetration occurs during additional heating involved in subsequent processing.

Figure 1G:
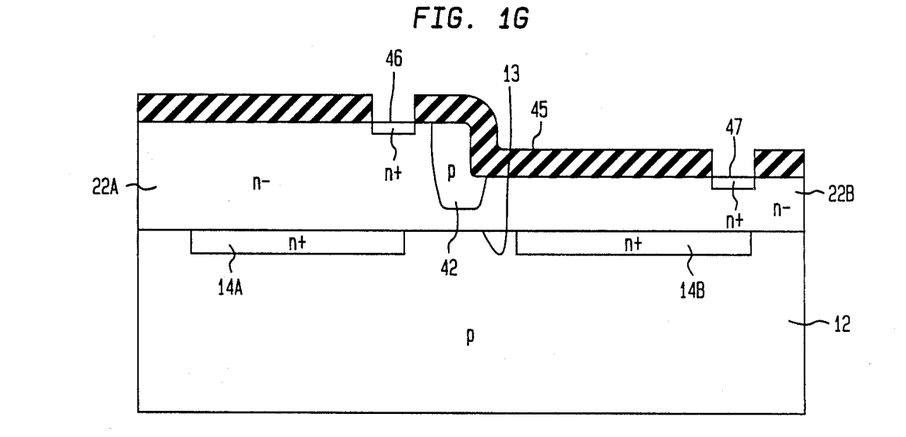

With reference now to FIG. 1G, after stripping the masking layer 40 from the surface of the layer 22, there is substituted a new masking layer 45, also typically a conventional thermally grown silicon oxide layer. This layer 45 is for use in defining a pair of plugs to be formed at the surface of the layer 22 for use as the collector plugs (contacts) to the buried layers 14A, 14B. To this end, after its formation, the masking layer 45 is patterned to form separate openings over both thick and thin portions 22A, 22B, respectively, of the layer 22. These openings are then used to define heavily doped n-type surface regions 46, 47 in the epitaxial layer 22, each typically positioned over an end of the n-type buried layers 14A and 14B, respectively. Typically regions 46 and 47 are formed by implantation of a suitable donor, such as phosphorus. Eventually, as the result of subsequent heating of the wafer in the process, the doped region 47 in the thin epitaxial portion 22B advantageously is driven in enough to essentially reach the buried layer 14B for use as one collector plug (contact).

It is usually not necessary to drive doped region 46 completely through the thick epitaxial region 22A to the buried layer 14A for use as the other collector plug (contact).

To minimize series collector resistance when such drive-in is not complete, one could dope the first epitaxial deposition phase layer 18 more heavily n-type than the second epitaxial phase deposition layer 20. Alternatively, an appropriate portion of the buried collector layer 14A may be additionally doped initially with a fast diffusing donor, such as phosphorus. During the subsequent processing this phosphorus will diffuse upwards into the epitaxial layer to meet the downwardly diffusing plug regions 46.

Figure 1H:
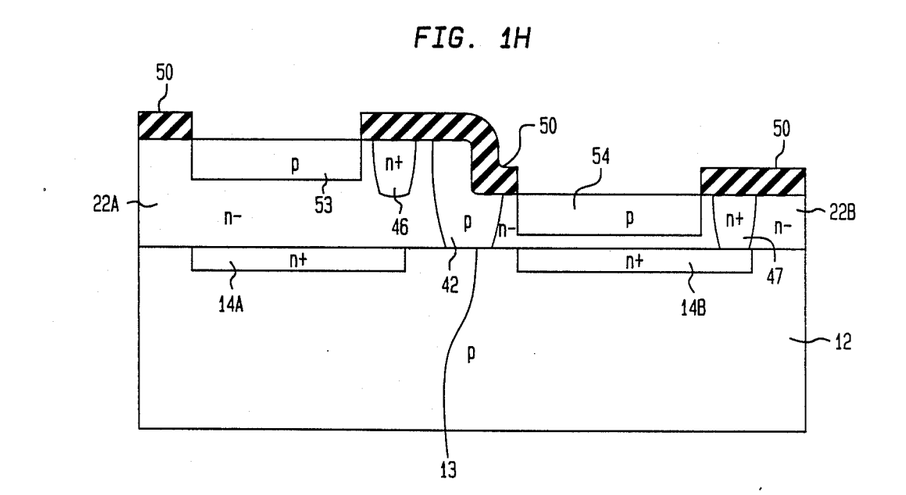

Next, with reference to FIG. 1H, masking layer 45 is removed (stripped). Then a new masking layer 50, again typically a conventional thermally grown silicon oxide layer, is deposited and suitably patterned to define apertures where p-type base regions 53, 54 are to be formed in the thick and thin epitaxial portions 22A, 22B, respectively. To this end, after such patterning, p-type base regions 53 and 54 are formed, typically, either by vapor-solid diffusion or ion implantation, of a suitable acceptor impurity, typically boron.

In some instances, it may be desired to form base regions 53, 54 of different sizes and/or doping characteristics, in which case each base region would be formed separately. Typically, the base region of the larger of the two transistors is formed first in the thicker portion 22A of the epitaxial layer 22. In this case, a first masking layer, appropriately provided with one aperture for defining the base region of this transistor, is formed over the entire epitaxial layer 22 and followed with a first diffusion step for forming the base region of this transistor. Next, a second masking layer, appropriately apertured for defining the base region of the smaller transistor, is formed over the entire epitaxial layer 22. A second diffusion step follows for forming its base region. The masking layer is then stripped.

There remains the need to provide the n-type emitter regions of the two transistors. To this end, with reference to FIG. 1J, after stripping the base diffusion masking layer 45, there is deposited over layer 22 a new masking layer 60. Layer 60, which is also typically a conventional thermally grown silicon oxide masking layer, is then appropriately apertured. Typically openings (apertures) are provided both over the diffused base regions 53, 54 where each emitter is to be formed and also over the collector plugs 46, 47 so that the doping at their surfaces may be increased. Such increase is useful to reduce the series resistance of the collector connections to be provided thereto.

Figure 1J:
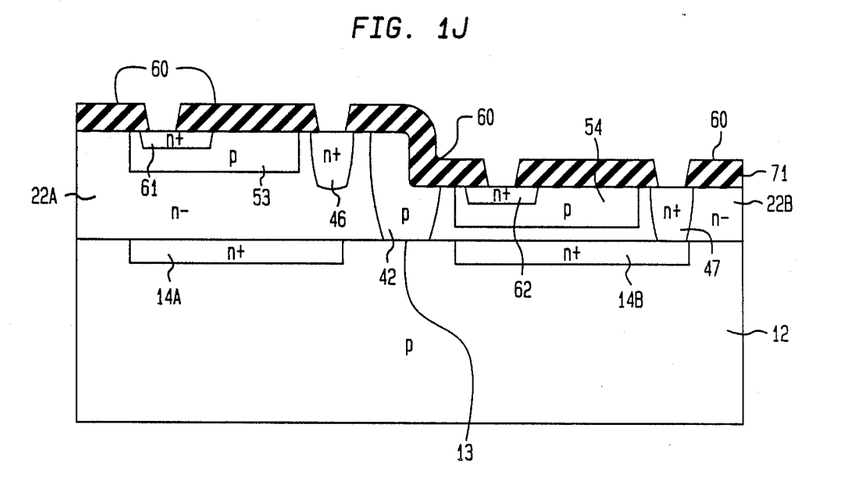

After the apertures in masking layer 60 are formed, donor ions are introduced selectively into the epitaxial layer 22 to form the desired n-type doped emitter regions 61, 62 and to more heavily dope the plugs 46, 47. The n+ shown within emitter regions 61, 62 indicates that they are relatively heavily doped. Typically the introduction may be done either by ion implantation, followed by drive-in and annealing, or by a vapor-solid diffusion. Generally phosphorus or arsenic ions are used.

Additionally, if desired, the emitters 61, 62 of the transistors can be formed in separate steps using the basic techniques described for the formation of separate base regions.

Moreover, in some instances, it is desirable to overlay the emitter regions with doped polysilicon. In such a case, an appropriate masking layer is deposited over the wafer surface and is patterned to expose the emitter regions. Then a polysilicon layer is deposited over the masked surface and doped heavily with a donor, such as phosphorus. The wafer is then heated so that the polysilicon alloys selectively to it at the exposed emitter regions and the phosphorus diffuses into the emitter regions. The polysilicon is then masked and etched while the emitter mask remains in place.

Figure 1K:
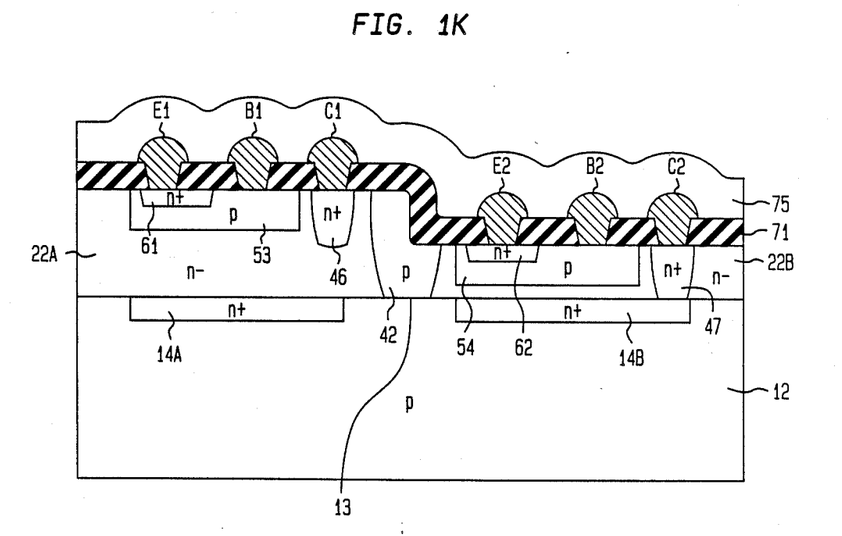

There then remains the need to provide electrode connections to the emitter, base and collector regions of the transistors. Any of the known techniques can be used for this procedure. A typical result is shown in FIG. 1K. To achieve this, there is first deposited an insulating layer 71, typically of a silicon oxide and/or silicon nitride over the surface of the wafer 10. Layer 71 is then patterned appropriately to define contact vias to the emitter, base and collector plug regions 61, 53 and 46, and 62, 54 and 47, respectively. Next a conductive layer, typically of a metal such as aluminum, or of heavily doped polysilicon, is deposited over the patterned insulating layer 71 to fill the vias therein. This conductive layer in turn is then patterned appropriately to form in the vias the separate emitter, base, and collector electrodes labelled E1 and E2, B1 and B2, and C1 and C2, respectively.

In a typical design of the final structure shown in FIG. 1K, the relevant parameters are a follows:

Epitaxial portions 22A and 22B are 5 microns and 2 microns thick, respectively, and the original epitaxial material would include an average arsenic concentration of about $3.0 \times 10^{15}$ impurities per cubic centimeter to provide about 1.5 ohm-centimeter resistivity.

Diffused well portions 53 and 54 are each about 0.45 micron deep with a sheet resistivity at their surface of about 1000 ohms per square.

Emitter regions 61 and 62 each have depth into the silicon of about 0.2 micron with a sheet resistivity at their surface in the silicon of about 165 ohms per square.

The collector plugs 46 and 47 have an average doping concentration of phosphorus of about $5 \times 10^{19}$ impurities per cubic centimeter or about 10–20 ohms per square.

The buried collector layers 14A and 14B have an average resistivity of about 20 ohms-centimeter.

The junction isolation region 42 has a sheet resistivity of about 100 ohms per square.

The lateral dimensions of the various regions would be chosen to provide the current rating desired for the device and would be in the range typical of planar junction transistors. Typical lateral dimensions are as follows: 55 microns by 70 microns for the area of the larger transistor and 30 microns by 35 microns for the area of the smaller transistor.

It is often advantageous in an integrated circuit device to include crossovers or crossunders for the various interconnections. This usually is best done by including at least two levels of metal and/or doped polysilicon for the interconnections with insulating layers between the levels to isolate crossovers and crossunders. In the interest of simplicity, these are not shown herein. Finally, it is usual to include, as shown in FIG. 1K, a passivation layer 75 of an insulator, typically silicon nitride or a silicate glass, over the surface as a final barrier to impurities in the atmosphere.

It can be appreciated that the specific chip described is merely illustrative of the general principles of the invention and various other chips may be devised to solve other types of problems.

For example, the principles of the invention are readily applicable to a silicon chip combining CMOS transistors with bipolar junction transistors. To reduce the chances of latchup the CMOS circuitry is localized in a thin portion of an epitaxial layer over an appropriate buried layer, while protective bipolar circuitry is localized in a thicker portion of the epitaxial layer.

Alternatively, when Diffusion Metal-Oxide-Semiconductor (DMOS) power transistors are formed in a chip including an n-type epitaxial layer over a p-type substrate, it is desirable to use a thick n-type epitaxial layer. Such a thick epitaxial layer is not usually suited for the logic part of a circuit that would be useful for control of the DMOS power transistors. Accordingly in such an instance, the invention can be used to form over a suitable substrate an epitaxial layer including a thin portion for the logic devices and a thick portion for the power devices.

Moreover as previously mentioned, the epitaxial layer may be formed to have two portions of different thickness where a p-n junction is included in the thicker portion by growing the two epitaxial deposition phases of different conductivity type. By appropriate choice of deposition conditions, this technique can form p-n junctions which should be quite abrupt, e.g. only several hundred Angstroms thick.

Moreover, it is apparent from FIG. 1E that in the embodiment just described, the formation of the merged layer 22 results in non-planarity of a resulting top surface of the wafer 10. This may be useful in the processing to serve as a boundary between the two positions of different thicknesses of the epitaxial layer. If greater planarity is important, this can be achieved by a slight modification in the initial preparation of the surface on which the epitaxial layer is to be formed.

Figure 2A:
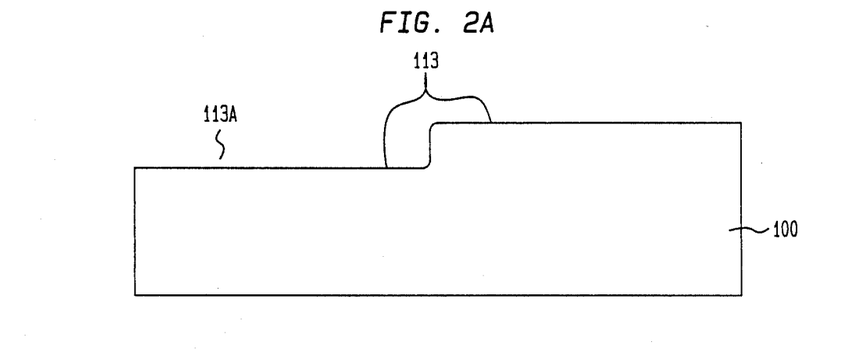
FIGS. 2A and 2B show cross sectional views of a silicon wafer in the course of being treated to include an epitaxial layer having two portions of different thicknesses and a planar top surface, in accordance with another embodiment of the invention.

Referring now to FIG. 2A, there is shown a silicon wafer 100 whose to surface 113 has been prepared in advance to compensate for the different thicknesses of the epitaxial layer to be later deposited. As seen, the wafer 100 has been thinned, typically by etching, at regions corresponding to surface portion 113A of top surface 113.

Figure 2B:
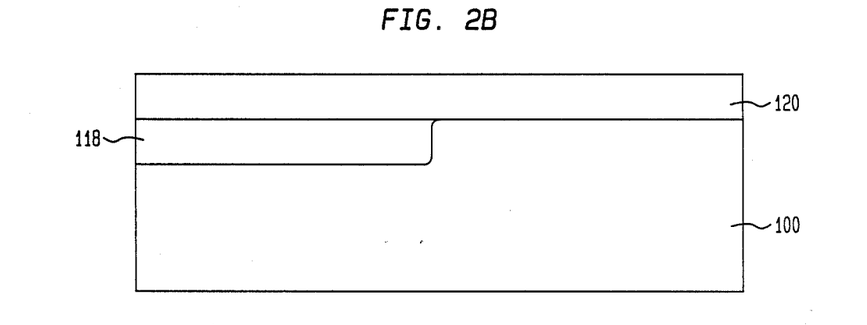

Referring now to FIG. 2B, there is shown the wafer 100 after two separate deposition phases, to form successively, limited epitaxial portion 118 and blanket epitaxial portion 120. These are formed in the manner of epitaxial layers 18 and 20 as seen in FIG. 1E. The resultant is a wafer having a top surface which is substantially planar and having an epitaxial layer (118, 120) with two portions of different thickness.

In some applications, it is desirable to increase the height of the step shown in FIGS. 1E through 1K.

Figure 3A:
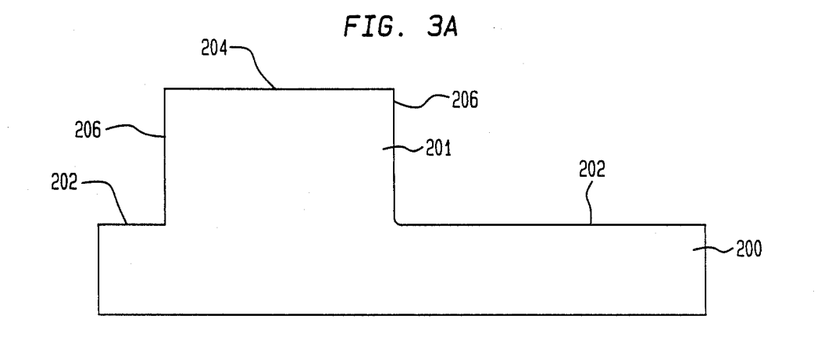
FIGS. 3A through 3C show cross sectional views of a silicon wafer in the course of being treated to include an epitaxial layer having two portions of different thicknesses of which the thicker portion is localized on a mesa, in accordance with still another embodiment of the invention.
Figure 3B:
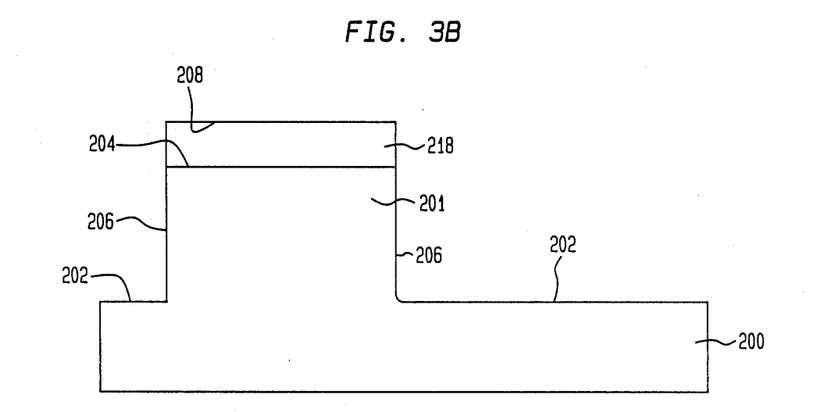

Referring now to FIG. 3A, there is shown a wafer 200 that has a top surface 202 which is essentially planar and has a mesa portion 201 which has an essentially planar top surface 204 and vertical sidewalls 206. A sacrificial masking layer (not shown) is deposited over the top surfaces 202 and 204 of the wafer 200 and then is removed selectively from the top surface 204 of the mesa 201. A first epitaxial deposition phase follows. The result of the first deposition phase, shown in FIG. 3B, is the formation of an epitaxial layer 218 which covers only top surface 204 of mesa 201. Layer 218 has a top surface 208. Then, after removal in situ of the sacrificial masking layer, a second deposition phase is used to grow an epitaxial layer 220 over the top surface 208 of the epitaxial layer 218 and over top surface 202.

Because the side walls 206 of the mesa 201 correspond to crystal planes unfavorable for epitaxial growth, this second deposition phase deposits less on the sidewalls 206 of the mesa 201, and any such deposit is of poorer crystallinity. This deposit can be removed selectively later because generally such deposit will etch faster as compared to a high quality monocrystalline silicon.

Figure 3C:
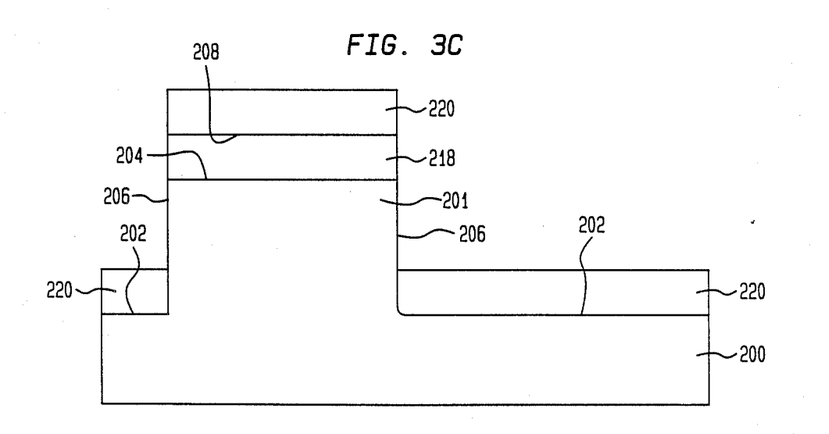

The result, after the removal of the deposit on the side walls 206, is shown in FIG. 3C. The height of the original mesa 201 is increased by the thicknesses of epitaxial layer 218 and epitaxial layer 220. The height of the remainder of the wafer 200 (the portion including surface 202) is increased only by the thickness of layer 220. Additionally, the epitaxial layer portion on the mesa 201 formed by layers 218 and 220 is separated from the portion of epitaxial layer 220 on surface 220 because of the removal of any epitaxial material on the sidewalls 206 of the mesa 201.

The deposit on the sidewalls 206 of the mesa 201 can be left if it is desired to maintain continuity in the epitaxial layer. Layer 220 can be sufficiently increased in thickness so as to result it becoming a continuous layer which essentially merges with the epitaxial material of layer 218.

It is, of course, feasible by choice of the geometry of the sacrificial layer to control the geometry of the thick and thin portions of the epitaxial layer as desired.

For example, it will be advantageous in some instances to form a thicker portion of an epitaxial layer around the periphery of a chip for locating there protective elements and bonding pads. A thinner portion of the epitaxial layer is formed in a central portion of the chip for locating logic circuits there. Alternatively, where few protective elements are needed, it may be preferable to spot such elements in limited thicker portions of an epitaxial layer, spotted at discrete areas widely spaced over the surface of the chip.

Figure 4A:
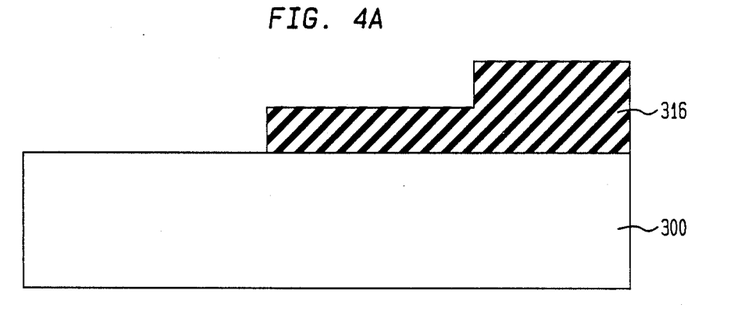
FIGS. 4A through 4F show cross sectional views of a silicon wafer in various stages of a process for the formation of an epitaxial layer having three portions of different thicknesses, in accordance with still another embodiment of the invention.

Moreover, as alluded to previously, it is also feasible to use the invention to grow an epitaxial layer having portions of at least three different thicknesses. To this end, as shown in FIG. 4A, there is initially formed over a front surface of wafer 300 a sacrificial layer 316 of varying thicknesses. In particular, it has a thickness of 200 Angstroms where the thinnest portion of the epitaxial layer is desired, a thickness of 100 Angstroms where the portion of the epitaxial layer of intermediate thickness is desired and is apertured where the thickest portion of the epitaxial layer is desired.

Figure 4B:
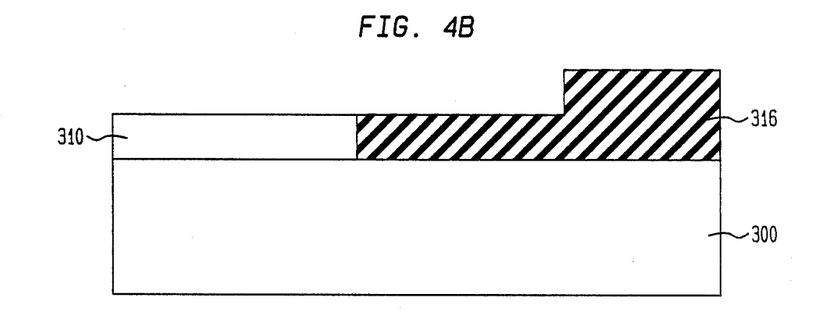

Then as seen in FIG. 4B, there is grown a first phase portion of an epitaxial layer 310 selectively over portions of the front surface of wafer 300 initially free of masking layer 316.

Figure 4C:
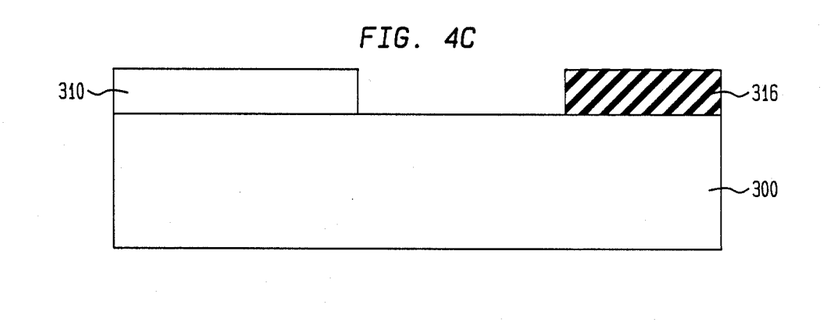

This is followed by the complete removal of the thinner portion of the masking layer 316 and the thinning of its thicker portion in a first partial removal stage. The removal can be done in the manner previously described and the partial removal is controlled by the length of time the masking layer is exposed to the removal ambient. The result is shown in FIG. 4C.

Figure 4D:
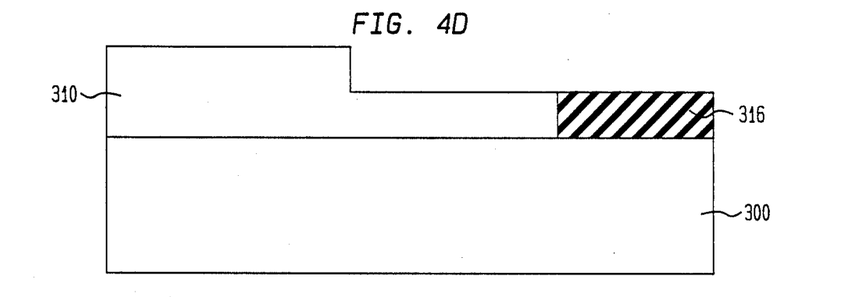

This is followed by a second selective deposition phase to increase the thickness of the epitaxial layer 310 where initially grown and to extend it laterally over the freshly exposed region of the surface of wafer 300. The result is seen in FIG. 4D.

Figure 4E:
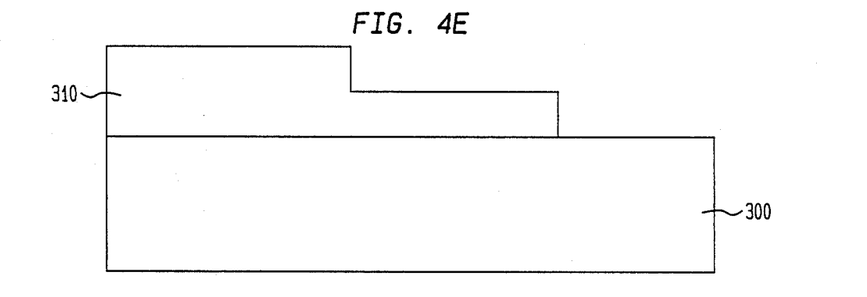

A second removal stage then completes the removal of masking layer 316 as seen in FIG. 4E.

Figure 4F:
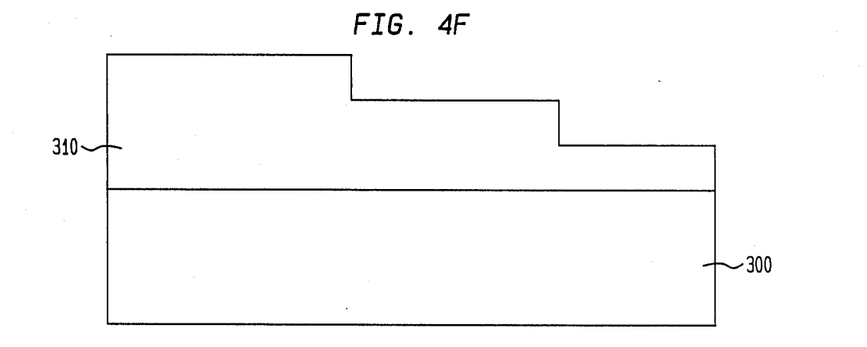

Finally, a third deposition phase extends the epitaxial layer 310 laterally over the remaining portion of the surface of wafer 300 and thickens the previously grown material to arrive at the result shown in FIG. 4F.

It can be appreciated that even a greater number of thicknesses may be achieved so long as there is adequate control both of the initial thicknesses of the sacrificial layer and of the amount of thickness that can be selectively removed by each removal stage. Moreover, each of the portions of different thicknesses can be provided with different electronic properties.

It should also be apparent that an equivalent result can be obtained by using a patterned sacrificial masking layer of which a first portion is removable selectively in a first gaseous ambient and the remaining portion is removable in a second different gaseous ambient. Then for the first removal stage, a first baking in the first ambient would remove selectively only the first portion of the sacrificial layer. Then for the second removal stage, another baking in the second ambient would remove the remainder of the sacrificial layer.

It should now be apparent that this technique can be extended to n thicknesses in the epitaxial layer by increasing the complexity of the sacrificial masking layer to (n−1) portions of different thicknesses and/or different characteristics that are removable selectively in situ.

It is, of course, to be understood that the specific details of the various epitaxial deposition phases and the sacrificial layer removal stages are merely illustrative of the general principles of the invention. Moreover, it should be feasible to employ sacrificial layers of other than silicon oxide material consistent with the spirit of the invention. Such other sacrificial needs both to serve effectively as a barrier to nucleation of silicon, and to be selectively removable in situ.

Moreover, the general principles are obviously applicable to other useful semiconductor systems. For example, the invention is applicable to the epitaxial deposition of a silicon layer having portions of different thicknesses on a sapphire substrate, or to the epitaxial deposition of a gallium arsenide epitaxial layer having portions of different thicknesses, on a gallium arsenide or other compatible substrate. In some applications the deposition of the epitaxial layer might best be done in a molecular beam epitaxy furnace and the sacrificial layer should then be chosen to be removable in situ in such a furnace. Finally, it should be apparent that an epitaxial layer of varying thickness need not be formed to extend over an entire front or back surface of a wafer but only over selected portions of such a surface. To this end, the remainder of the surface would be suitably shielded during the processing by a mask. Such mask should be impervious to the ambient used to remove the sacrificial masking layer and also ill-adapted for the growth thereover of epitaxial material.

The embodiments of the invention in which an exclusive property or privilege is claimed are defined as follows:

1. In the manufacture of an integrated circuit in a semiconductive wafer, the process of forming in the wafer an epitaxial layer having portions of at least two different thicknesses comprising the steps of:
   preparing one surface of a monocrystalline semiconductive wafer for the growth thereon of epitaxial material;
   forming over at least one region of said one surface of the wafer a sacrificial masking layer of a material that can serve as a barrier to the nucleation of epitaxial material thereover and that can be removed in situ, while leaving at least one other region of said one surface of the wafer free of the sacrificial masking layer;
   heating the wafer in a furnace in which there is an ambient suitable for depositing the desired epitaxial material to a first thickness selectively over regions of the one surface free of the sacrificial masking layer;
   treating the one surface of the wafer in situ in an ambient suitable for removing selectively the sacrificial masking layer at least at the other regions of the one surface for exposing the underlying regions of the one surface; and
   heating the wafer in an ambient suitable for the deposition of epitaxial material both over the previously deposited epitaxial material and over the exposed regions of the one surface, thereby to form an epitaxial layer over said one surface having portions of different thickness.

2. The process of claim 1 in which the semiconductive wafer is silicon and the sacrificial masking layer is a silicon oxide that is removable by baking in a reducing ambient.

3. The process of claim 2 in which the sacrificial masking layer is of essentially uniform thickness and is entirely removed by said baking in a hydrogen ambient.

4. The process of claim 2 in which:
   the sacrificial masking layer is initially formed of two regions of different thicknesses and the thinner of the two regions is removed in a first removal step following the deposition of the desired epitaxial material to a first thickness;

the thicker of the two regions is removed in a second removal step after the previously deposited epitaxial material has had its thickness increased to the second thickness in a second deposition step; and then the wafer is heated again in an ambient suitable for the blanket deposition of additional epitaxial material over the wafer as a third deposition step, whereby there is formed over the wafer an epitaxial layer having portions of three different thicknesses.

5. A process for forming an epitaxial layer having portions of two different thicknesses on a silicon monocrystalline wafer comprising the steps of:

forming over one surface portion of the wafer a sacrificial layer of a silicon oxide;

patterning the sacrificial layer thereby to expose selected regions of said surface portion of the wafer;

heating the wafer in a suitable ambient for growing epitaxial silicon to form an epitaxial layer portion of a first thickness selectively localized at said exposed selected regions;

removing in situ the patterned sacrificial layer by baking the wafer in a hydrogen atmosphere for a sufficient period of time, thereby exposing the remainder of said one surface portion of the wafer; and reheating the wafer in a suitable ambient for growing epitaxial silicon to thicken said epitaxial layer portion of first thickness to a larger thickness and to form over said remainder of said one surface portion of the wafer an epitaxial layer portion of thickness smaller than said first thickness.

6. The process of claim 5 in which the patterned sacrificial layer has a thickness of at least 5 Angstroms.

7. The process of claim 6 in which said first thickness is about three microns, said larger thickness is about five microns, and said smaller thickness is about two microns.

8. The process of claim 5 in which the heating and reheating steps and the baking step are all performed in the same furnace without removal of the wafer from the furnace until said heating, reheating and baking steps have been completed.

9. The process of claim 5 in which the ambient for said heating step is a gaseous mixture comprising dichlorosilane and hydrochloric acid.

10. The process of claim 9 in which the ambient for said reheating step is a gaseous mixture comprising silicon tetrachloride.

11. The process of claim 10 in which the sacrificial layer is of silicon oxide reducible in a hydrogen ambient.

12. The process of claim 11 in which the sacrificial silicon oxide layer has a thickness of at least 75 Angstroms.

13. The process of claim 12 in which the sacrificial silicon oxide layer has a thickness of between 75 and 150 Angstroms.

14. The process of claim 13 in which the first thickness is about three microns, the larger thickness is about five microns and the smaller thickness is about two microns.

15. The process of claim 5 in which at least one transistor is formed in each of the portions of the epitaxial layer of different thicknesses.

16. The process of claim 15 in which the transistor formed in the thicker epitaxial portion is designed to tolerate higher voltages than the transistor formed in the thinner epitaxial portion but the latter transistor has a higher switching speed than the former transistor.

17. A process for forming over a surface portion of a semiconductor wafer an epitaxial layer having three portions of different thickness comprising:

forming on said one surface of the wafer a sacrificial masking layer having regions of two different thicknesses, and including apertures exposing regions of the one surface portion of the wafer;

depositing epitaxial material selectively only on the exposed regions of the one surface portion of the wafer;

removing in situ the thinner of the two regions of different thicknesses of the sacrificial masking layer for exposing further regions of the one surface portion of the wafer;

depositing epitaxial material selectively only on the exposed regions of the one surface portion of the wafer;

removing in situ the remainder of the sacrificial masking layer for exposing the remainder of the one surface portion of the wafer; and depositing expitaxial material in blanket fashion over said one surface portion of the wafer.

18. A process for forming an epitaxial layer having portions of at least three different thicknesses over a surface portion of a wafer comprising the steps of:

forming over said surface portion a sacrificial masking layer having at least two portions of different removal characteristics and including apertures for exposing regions of the surface portion of the wafer;

depositing epitaxial material selectively only on the exposed regions of said surface portion of the wafer;

removing in situ selectively one of the two portions of the sacrificial masking layer for exposing further regions of said surface portion of the wafer;

depositing epitaxial material selectively only on the exposed regions of said surface portion of the wafer;

removing in situ selectively the other portion of the two portions of the sacrificial masking layer to expose further regions of said surface portion of the wafer; and depositing epitaxial material over the exposed regions of said surface portions of the wafer.

19. The process of claim 1 in which the one surface of the monocrystalline semiconductive wafer is initially non-planar because the wafer has at least one thinner portion, and the portion of the epitaxial layer of greater thickness is deposited in the thinner portion of the wafer, whereby the deposited epitaxial layer deposited restores substantial planarity to said one surface.

20. The process of claim 1 in which the one surface of the monocrystalline silicon wafer initially includes a mesa portion and the thicker portion of the two portions of the epitaxial layer is deposited selectively over the top surface of the mesa portion whereby the effective height of the mesa is increased after deposition of the epitaxial layer.

21. A process for forming over a moncrystalline substrate an epitaxial layer having portions of n different thickness comprising the steps of:

forming over a surface of the substrate a sacrificial masking layer made up of at least n−1 portions, each of which is selectively removable;

placing the substrate in a furnace and growing epitaxial material selectively over unmasked portions of the surface of the substrate;

removing selectively one portion of the sacrificial masking layer without withdrawing the substrate from the furnace;

growing epitaxial material selectively over unmasked surface portions of the substrate; and repeating in turn said removing selectively step and growing epitaxial material selectively step without withdrawing the substrate from the furnace until portions of n different thicknesses of epitaxial material have been grown over the surface of the substrate.

22. The process of claim 21 in which the sacrificial masking layer formed on the surface of the substrate has $n-1$ portions of different thicknesses.

23. The process of claim 21 in which the sacrificial masking layer formed on the surface of the substrate has $n-1$ portions different in either thickness or in composition.

* * * * *